US007231570B2

(12) United States Patent
Wang et al.

(10) Patent No.: US 7,231,570 B2
(45) Date of Patent: Jun. 12, 2007

(54) METHOD AND APPARATUS FOR MULTI-LEVEL SCAN COMPRESSION

(75) Inventors: Laung-Terng (L.-T.) Wang, Sunnyvale, CA (US); Khader S. Abdel-Hafez, San Francisco, CA (US); Boryau (Jack) Sheu, San Jose, CA (US); Shianling Wu, Princeton Junction, NJ (US)

(73) Assignee: Syntest Technologies, Inc., Sunnyvale, CA (US)

( * ) Notice: Subject to any disclaimer, the term of this patent is extended or adjusted under 35 U.S.C. 154(b) by 216 days.

(21) Appl. No.: 11/122,237

(22) Filed: May 5, 2005

(65) Prior Publication Data

US 2005/0268194 A1 Dec. 1, 2005

Related U.S. Application Data

(60) Provisional application No. 60/574,200, filed on May 26, 2004.

(51) Int. Cl.
*G01R 31/28* (2006.01)
(52) U.S. Cl. .................. 714/729; 714/738
(58) Field of Classification Search .......... 714/729, 714/738
See application file for complete search history.

(56) References Cited

U.S. PATENT DOCUMENTS

| 5,983,380 | A | 11/1999 | Motika et al. |
| 5,991,909 | A | 11/1999 | Rajski et al. |
| 6,026,508 | A | 2/2000 | Craft |
| 6,327,687 | B1 | 12/2001 | Rajski et al. |
| 6,611,933 | B1 | 8/2003 | Koenemann et al. |
| 6,684,358 | B1 | 1/2004 | Rajski et al. |
| 2003/0120988 | A1* | 6/2003 | Rajski et al. ............... 714/726 |
| 2003/0154433 | A1 | 8/2003 | Wang et al. |

OTHER PUBLICATIONS

K.-J. Lee et al, "Broadcasting Test Patterns to Multiple Circuits", *IEEE Transactions on Computer-Aided Design of Integrated Circuits and Systems*, vol. 18, No. 12, pp. 1793-1802, Dec. 1999.
Pandey et al, "An Incremental Algorithm for Test Generation in Illinois Scan Architecture Based Designs," Proc., IEEE 2002 Design. Automation and Test in Europe, pp. 368-375, 2002.
B. Koenemann, "LFSR-Coded Test Patterns for Scan Designs", *Proc., European Test Conf.*, pp. 237-242, 1991.

* cited by examiner

*Primary Examiner*—James C Kerveros
(74) *Attorney, Agent, or Firm*—Jim Zegeer

(57) ABSTRACT

A multi-level scan compression method and apparatus for reducing test data volume and test application time in a scan-based integrated circuit without reducing the speed of the scan chain operation in scan-test mode or self-test mode. The scan-based integrated circuit contains one or more scan chains, each scan chain including one or more scan cells coupled in series. Two or more decompressors are embedded between N compressed scan inputs and M scan chains, where N<M, to broadcast compressed scan data patterns driven through the N compressed scan inputs into decompressed scan data patterns stored in the M scan chains. The multi-level scan compression approach allows to speed up the shift-in/shift-out operation during decompression using two or more decompressors separated by intermediate scan chains. Two or more compressors are separated by intermediate scan chains to speed up the shift-in/shift-out operation during compression.

30 Claims, 8 Drawing Sheets

METHOD AND APPARATUS FOR MULTI-LEVEL SCAN COMPRESSION

RELATED APPLICATION DATA

This application claims the benefit of U.S. Provisional Application No. 60/574,200 filed May 26, 2004.

FIELD OF THE INVENTION

The present invention generally relates to the field of logic design and test using design-for-test (DFT) techniques. Specifically, the present invention relates to the field of logic test and diagnosis for integrated circuits using scan or built-in self-test (BIST) techniques.

BACKGROUND

Different scan compression techniques have emerged for compressing scan data patterns, generated using automatic test-pattern generation (ATPG) tools, for reducing both test application time and test data volume. Current scan compression techniques rely on inserting a decompressor between a limited number of compressed scan inputs and a large number of internal scan chains. The decompressor can be designed as a combinational circuit that generates decompressed scan data patterns for the internal scan chains depending on the compressed scan data patterns applied to the compressed scan inputs, or as a sequential circuit that can be used to generate the decompressed scan data patterns for the internal scan chains based on previously stored states of the sequential elements.

The following U.S. Patent Documents and other publications listed below are incorporated by reference.
U.S. Patent Documents

| | | |
|---|---|---|
| 6,327,687 | Dec. 1, 2001 | Rajski et al |
| 6,611,933 | August 2003 | Koenemann et al |
| 20030154433 | August 2003 | Wang et al |

Other Publications

K.-J. Lee et al, "Broadcasting Test Patterns to Multiple Circuits", *IEEE Transactions on Computer-Aided Design of Integrated Circuits and Systems*, Vol. 18, No. 12, pp. 1793–1802, December 1999.

A. R. Pandey et al, "An Incremental Algorithm for Test Generation in Illinois Scan Architecture Based Designs," Proc., IEEE 2002 Design, Automation and Test in Europe (DATE), pp. 368–375–2002.

B. Koenemann, "LFSR-Coded Test Patterns for Scan Designs", Proc., European Test Conf., pp. 237–242, 1991.

Scan compression techniques utilizing a combinational decompressor typically consist of an exclusive-OR (XOR) or multiplexor (MUX) tree that may be controlled by additional control inputs or controlled by an internally stored state. See the patent co-authored by Koenemann et al. (2003) and the patent application co-authored by Wang et al. (2003). Scan compression techniques utilizing a sequential decompressor typically embed a linear-feedback shift register (LFSR) between the compressed scan inputs and internal scan chains and use the compressed scan inputs to control the LFSR in a way that makes it generate the required decompressed scan data patterns, while utilizing 'don't care' states present in the decompressed scan data patterns to reduce the complexity of the problem. See the paper co-authored by Koenemann et al. (1991) and the patent co-authored by Rajski et al. (2001).

In general, scan compression techniques utilizing a sequential decompressor such as an LFSR circuit are difficult to use, requiring additional software to solve the linear equations involved in order to translate the decompressed scan data patterns into the external compressed scan data patterns that can be used to generate the required decompressed scan data patterns through the LFSR. In some cases, these linear equations can turn out to be unsolvable, requiring multiple iterative runs where the decompressed scan data patterns are reordered, duplicated, or regenerated in order to be able to generate compressed scan data patterns which covers all the required faults. This can result in a significant computational overhead. In general, the compression capability of these techniques is limited since it requires that the decompressed scan data patterns be generated loosely in order to guarantee that the compression equations can be solved. This results in compressing decompressed scan data patterns that are sub-optimal, as opposed to compressing tightly packed decompressed scan data patterns where both static and dynamic compaction are performed aggressively. Finally, any changes made to the circuit after generating the decompressed scan data patterns require abandoning these patterns and going back to the beginning of the iterative process. This makes these techniques much less attractive than techniques utilizing a combinational decompressor, built mainly out of XOR or MUX gates.

Current techniques utilizing a combinational decompressor, such as circuits built out of XOR or MUX gates, utilize different combinational circuit designs for generating the decompressed scan data patterns. In some techniques, the decompressed scan data patterns are generated such that the decompressed scan data patterns for each internal scan chain depends on multiple compressed scan inputs. In other techniques, the decompressed scan data patterns for each internal scan chain depends on only one compressed scan input, with a few additional control inputs used to alter the relationship for different scan patterns. Finally, in some techniques, sequential elements are used in place of the additional control inputs to alter the relationship for different scan patterns. These sequential elements are typically preloaded with different data for each scan pattern. The advantage of these techniques is that the relationship between the decompressed scan data patterns and the compressed scan data patterns is easy to define and understand, and can be easily incorporated into the ATPG tools as part of the vector generation process, such that the compressed scan data patterns are generated automatically, with dynamic compaction being aggressively applied.

The main difficulty with current decompression solutions utilizing a combinational decompressor is that the decompression is typically done in one stage, which is placed between the compressed scan inputs and the first scan cell of each internal scan chains. This introduces a long combinational path between the compressed scan inputs and the internal scan cells, which slows down the speed at which the scan chains can be operated. For example, a design including 8 compressed scan inputs and 512 internal scan chains (1 to 64 ratio) requires 6 levels of XOR gates, XOR gates being among the slowest combinational logic library cells. An additional delay is further introduced due to the fact that the first scan cell is typically located at a distance from the compressed scan inputs. Finally, since the compressed scan inputs are typically shared in normal mode, this can result in overloading the input pins and reducing the amount of time these pins can be operated at, which can adversely affect the regular chip functionality. The same problems exist in combinational decompressors utilizing MUX gates as their basic building block.

A similar problem exists when the scan data responses captured in the internal scan chains are compressed into compressed scan data responses driven out on a smaller number of compressed scan outputs. For compression techniques utilizing a sequential compressor, difficulties arise due to the fact that all unknowns now have to be accounted for and tolerated in scan mode (during shift-in and shift-out operations), which can result in a significant gate overhead for scan designs utilizing these techniques. For designs utilizing a combinational compressor, a similar number of XOR gate levels may have to be placed between the last scan cell of the internal scan chains and the compressed scan outputs, creating similar delays and loading problems as the combinational decompressor used on the input side. The same problems also exist in combinational compressor designs utilizing MUX gates as their basic building block.

Accordingly, there is a need to develop an improved method and apparatus for scan compression. The method we propose in this invention is based on using two or more decompressors and two or more compressors, and placing them in between the scan cells of the scan-based design.

SUMMARY OF THE INVENTION

Accordingly, in this invention, we propose to solve the difficulties that arise from using a combinational decompressor and compressor by splitting the decompressor into two or more decompressors separated by intermediate scan chains, and embedding them between the compressed scan inputs and the internal scan chains, such that the compressed scan inputs are driving the first decompressor inputs, and the last decompressor outputs are driving the internal scan chains inputs. Similarly, we propose splitting the compressor into two or more compressors separated by intermediate scan chains, and embedding them between the internal scan chains outputs and the compressed scan outputs, such that the internal scan chains outputs are driving the first compressor inputs, and the last compressor outputs are driving the compressed scan outputs. For example, for the design comprising 8 compressed scan inputs and 512 internal scan chains, the first decompressor is inserted such that the 8 compressed scan inputs drive the 8 inputs of the first decompressor, which is used to broadcast the compressed scan data to 16 intermediate scan chains each comprising one or more scan cells. Next, these 16 intermediate scan chains outputs are used to drive the inputs of a second decompressor, which is used to broadcast the compressed scan data to 32 intermediate scan chains, and this process is repeated until the last decompressor outputs are used to drive the inputs of the 512 internal scan chains. A similar process is used to split the compressor such that the 512 internal scan chains drive the inputs of the first compressor, and the last compressor drives the compressed scan outputs.

The main advantage of this technique is that since the decompressor and compressor are now split, it is possible to perform scan compression and where only one level of logic exists between any two scan cells, by dividing the long path between the compressed scan inputs (or outputs) and the internal scan chains over two or more decompressors (or compressors). This allows us to perform compressed scan at a similar speed as regular scan. A further advantage is that it allows us to better balance scan chains, by performing the scan decompression and compression at different lengths for different scan chains. This allows us to control all scan chains to be the same length regardless of the number of scan cells controlled by each compressed scan input.

BRIEF DESCRIPTION OF DRAWINGS

The above and other objects, advantages and features of the invention will become more apparent when considered with the following specification and accompanying drawings wherein.

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

Figure 1:
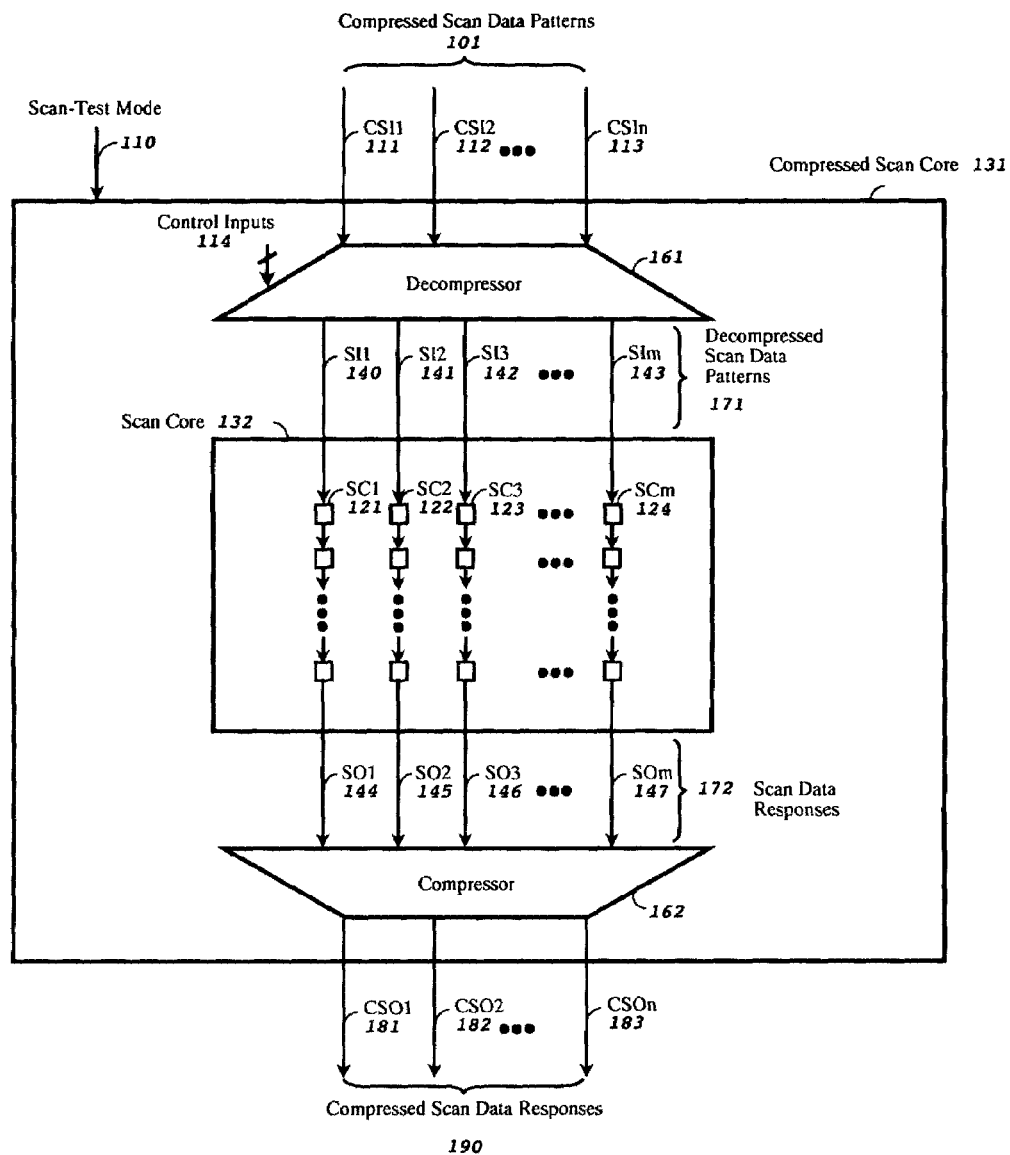
FIG. 1 shows a prior-art compressed scan test system for testing scan-based integrated circuits with compressed scan data patterns using an ATE (automatic test equipment)

FIG. 1 shows a prior-art compressed scan test system for testing scan-based integrated circuits with compressed scan data patterns using an ATE (automatic test equipment). The Compressed Scan Core 131 comprises a Scan Core 132 surrounded by a Decompressor 161 and Compressor 162. It further accepts a Scan-Test Mode 110 signal, and Compressed Scan Data Patterns 101 applied on external compressed scan inputs CSI1 111 to CSIn 113 to drive the Decompressor 161. The Decompressor 161 also accepts Control Inputs 114 to control the Decompressor during scan-test. The Decompressor accepts the Compressed Scan Data Patterns 101 and generates Decompressed Scan Data Patterns 171 on the internal scan chain inputs SI1 140 to SIm 143 to drive the scan chains SC1 121 to SCm 124 embedded in Scan Core 132. Scan chain outputs SO1 144 to SOm 147 are then used to drive Compressor 162 to compact the Scan Data Responses 172 into Compressed Scan Data Responses 190 driven out of the Compressed Scan Core 131 on external compressed scan outputs CSO1 181 to CSOn 183. In this prior-art compressed scan test system, the ATE generates and applies the Compressed Scan Data Patterns 101 to the Compressed Scan Core 131, and accepts the Compressed Scan Data Responses 190 for comparison.

Figure 2:
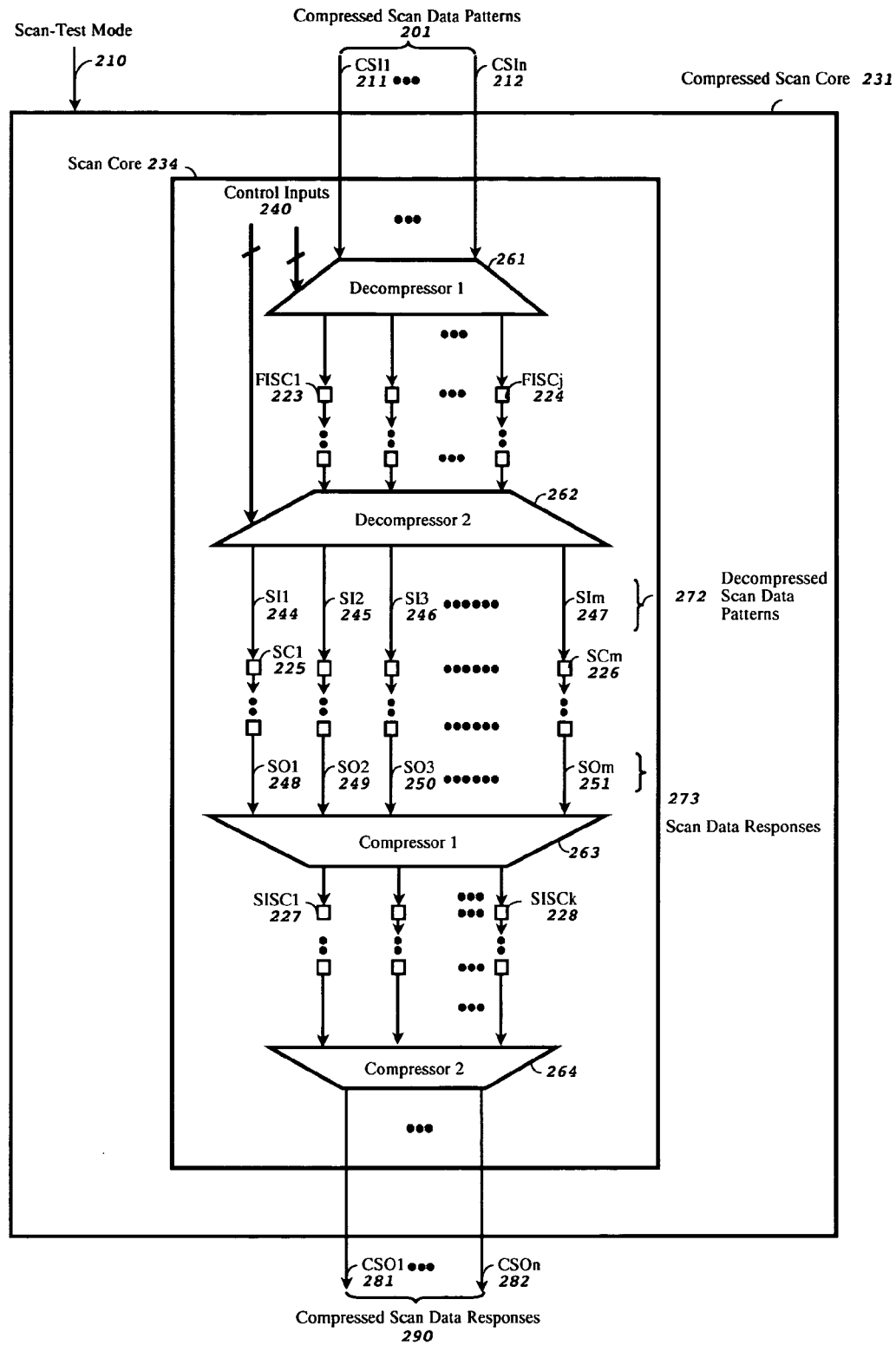
FIG. 2 shows a first embodiment of a multi-level compressed scan test system, in accordance with the present invention, for testing scan-based integrated circuits.

FIG. 2 shows a first embodiment of a multi-level compressed scan test system, in accordance with the present invention, for testing scan-based integrated circuits. The Compressed Scan Core 231 comprises a Scan Core 234 with two decompressors Decompressor1 261 and Decompressor2 262 and two compressors Compressor1 263 and Compressor2 264 embedded in the Scan Core 234. The Scan Core 234 also comprises J First Intermediate Scan Chains FISC1 223 to FISCj 224 embedded between Decompressor1 261 and Decompressor2 262, K Second Intermediate Scan Chains SISC1 227 to SISCk 228 embedded between Compressor1 263 and Compressor2 264, and M scan chains SC1 225 to SCm 226.

The Compressed Scan Core 231 further accepts a Scan-Test Mode 210 signal, and Compressed Scan Data Patterns 201 applied on external compressed scan inputs CSI1 211 to CSIn 212 to drive the inputs of the first decompressor Decompressor1 261, which also accepts Control Inputs 240 to control the Decompressor1 261 during scan-test. The Decompressor1 261 reads in the Compressed Scan Data Patterns 201 and its outputs are used to drive the second decompressor Decompressor2 262 after passing through the J First Intermediate Scan Chains FISC1 223 to FISCj 224 to generate Decompressed Scan Data Patterns 272 on the internal M scan chain inputs SI1 244 to SIm 247 to drive the M scan chains SC1 225 to SCm 226 embedded in Scan Core 234.

The M scan chain outputs SO1 248 to SOm 251 are then used to drive the first compressor Compressor1 263, and its outputs are used to drive the second compressor Compressor2 264 after passing through the K Second Intermediate Scan Chains SISC1 227 to SISCk 228 to compact the Scan Data Responses 273 into Compressed Scan Data Responses 290, which are driven out of the Compressed Scan Core 231 on external compressed scan outputs CSO1 281 to CSOn 282.

In this first embodiment of a multi-level compressed scan test system, the Compressed Scan Data Patterns 201 are either generated externally on an ATE during scan-test, or generated internally using a PRPG (pseudorandom pattern generator) or RPG (random pattern generator) during self-test. Similarly, the Compressed Scan Data Responses 290 are either compared externally on an ATE during scan-test, or compacted internally using a MISR (multiple-input signature register) during self-test.

Figure 3:
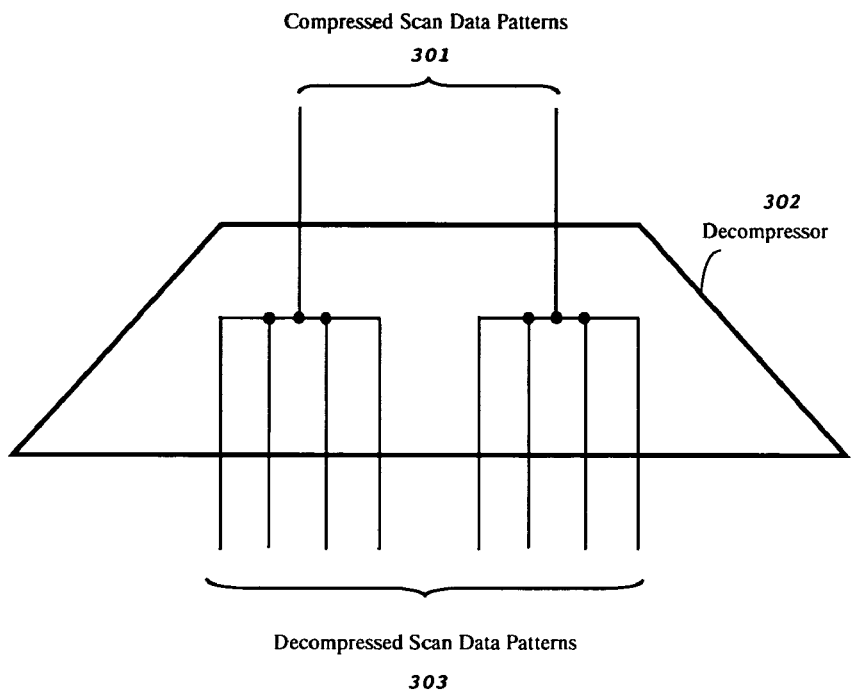
FIG. 3 shows a first embodiment of a multi-level decompressor, in accordance with the present invention.

FIG. 3 shows a first embodiment of a multi-level decompressor, in accordance with the present invention. The Decompressor 302 accepts Compressed Scan Data Patterns 301, and broadcasts them over multiple outputs to generate Decompressed Scan Data Patterns 303.

Figure 4:
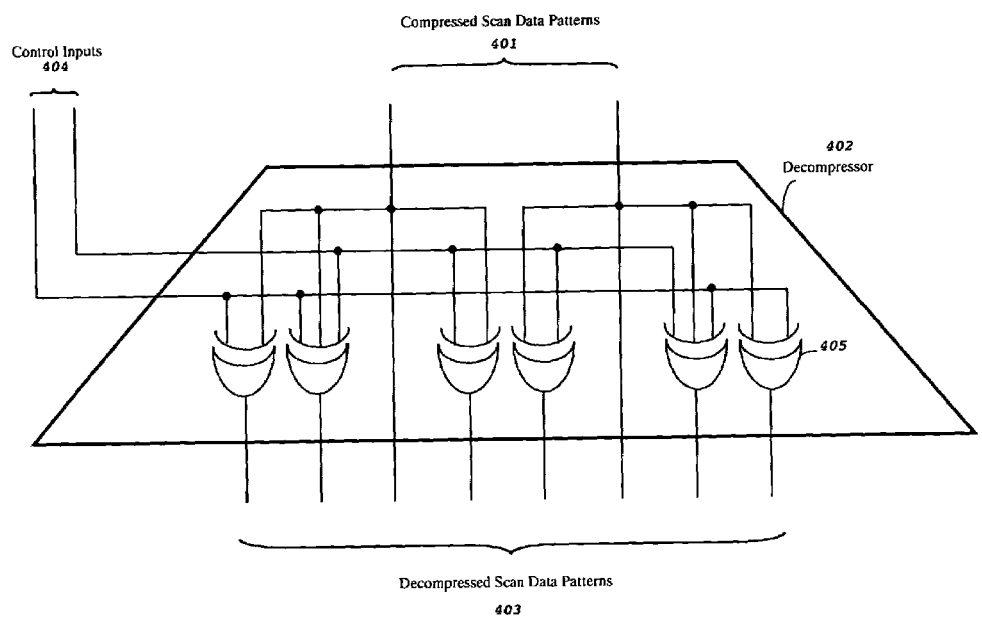
FIG. 4 shows a second embodiment of a multi-level decompressor, in accordance with the present invention.

FIG. 4 shows a second embodiment of a multi-level decompressor, in accordance with the present invention. The Decompressor 402 accepts Compressed Scan Data Patterns 401 and Control Inputs 404 to generate Decompressed Scan Data Patterns 403 by utilizing exclusive-OR (XOR) gates 405. The optional Control Inputs 404 are used to alter the relationship for different scan patterns, in order to improve fault coverage and fault diagnosis.

Figure 5:
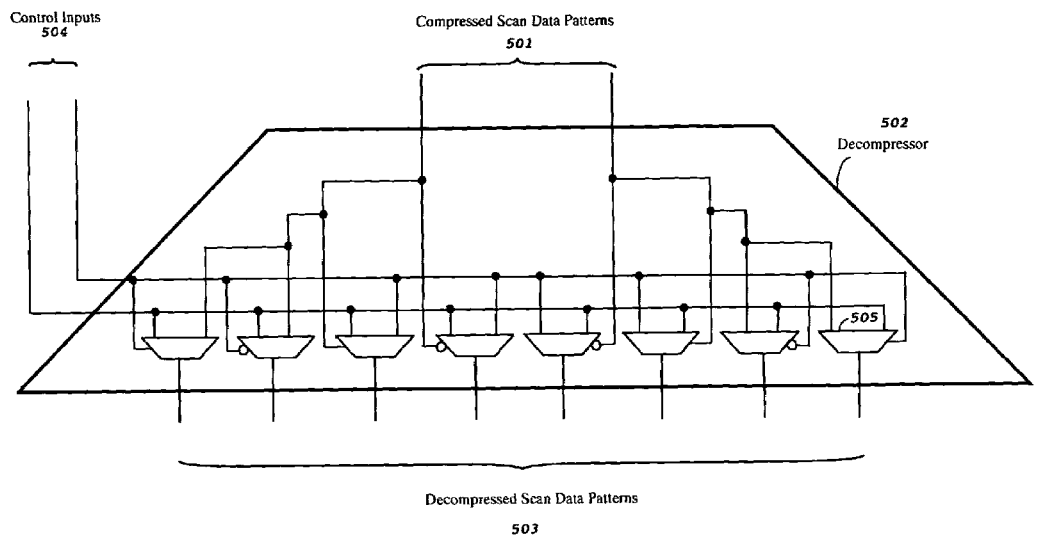
FIG. 5 shows a third embodiment of a multi-level decompressor, in accordance with the present invention.

FIG. 5 shows a third embodiment of a multi-level decompressor, in accordance with the present invention. The Decompressor 502 accepts Compressed Scan Data Patterns 501 and Control Inputs 504 to generate Decompressed Scan Data Patterns 503 by utilizing multiplexor (MUX) gates 505. The optional Control Inputs 504 are used to alter the relationship for different scan patterns, in order to improve fault coverage and fault diagnosis.

Figure 6:
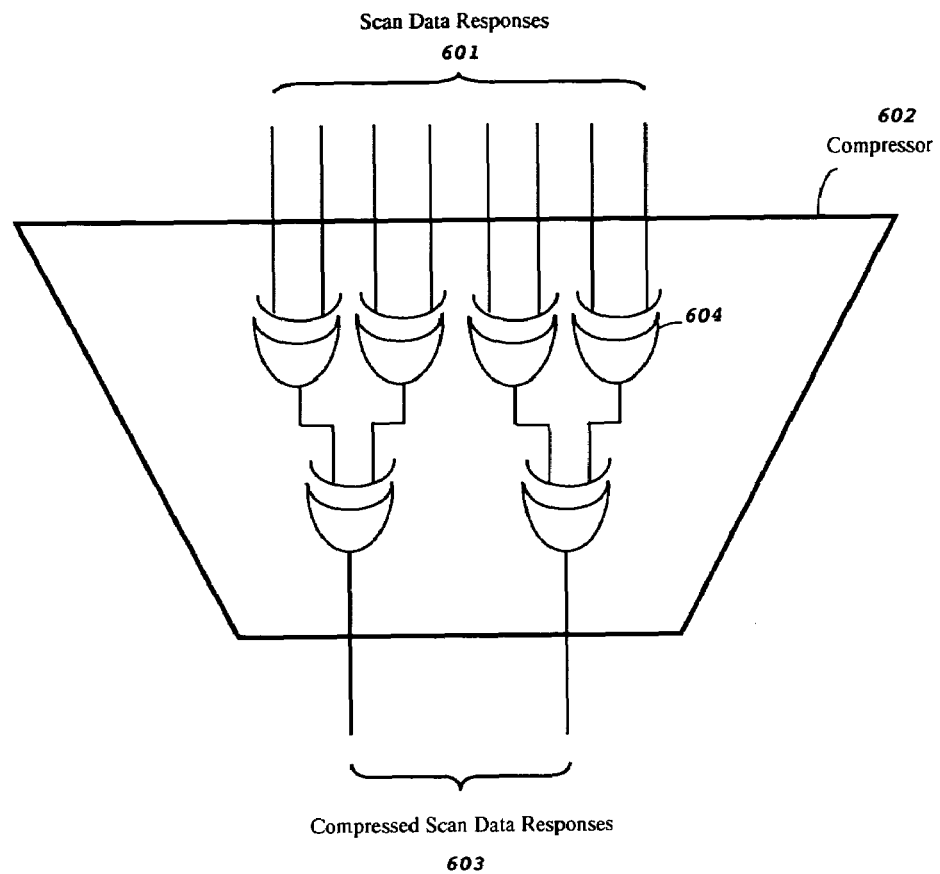
FIG. 6 shows a first embodiment of a multi-level compressor, in accordance with the present invention.

FIG. 6 shows a first embodiment of a multi-level compressor, in accordance with the present invention. The Compressor 602 accepts Scan Data Responses 601 to generate Compressed Scan Data Responses 603, by utilizing exclusive-OR (XOR) gates 604. A compressor utilizing an X-tolerant XOR network, having at least one internal scan chain output connected to two or more XOR gates, is also included within the scope of this invention.

Figure 7:
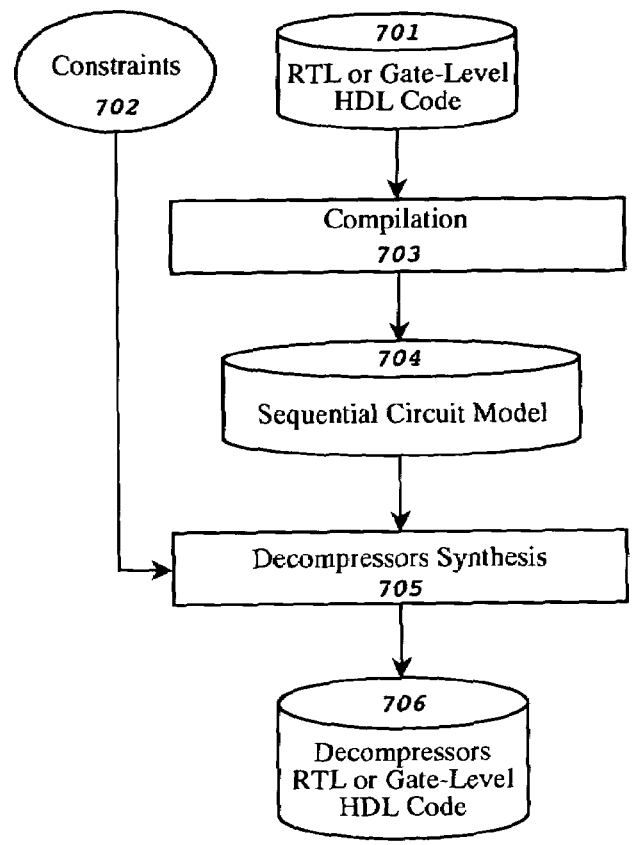
FIG. 7 shows a flow diagram of a method for synthesizing two or more decompressors in either RTL (register-transfer level) or gate-level, in accordance with the present invention.

FIG. 7 shows a flow diagram of a method for synthesizing two or more decompressors in either RTL (register-transfer level) or gate-level, in accordance with the present invention. In this flow diagram, RTL or Gate-Level HDL Code 701 goes through Compilation 703 to generate Sequential Circuit Model 704. Next, Decompressors Synthesis 705 is performed according to Sequential Circuit Model 704 and Constraints 702 to generate Decompressors RTL or Gate-Level HDL Code 706. The Decompressors RTL or Gate-Level HDL Code 706 is generated as a combinational logic network comprising any combination of logic gates, such as AND gates, OR gates, NAND gates, NOR gates, XOR gates, XNOR gates, multiplexers, buffers, and inverters.

Figure 8:
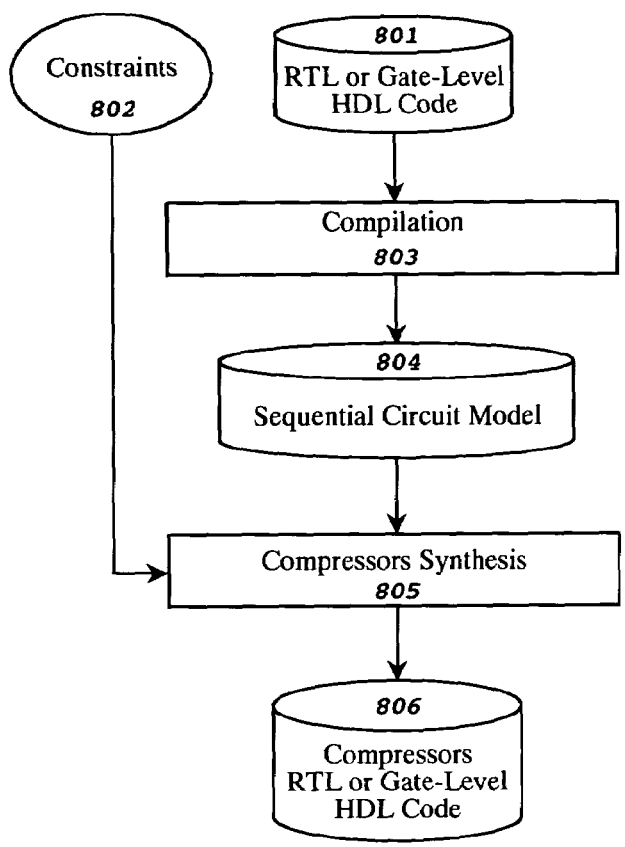
FIG. 8 shows a flow diagram of a method for synthesizing two or more compressors in either RTL (register-transfer level) or gate-level, in accordance with the present invention.

FIG. 8 shows a flow diagram of a method for synthesizing two or more compressors in either RTL (register-transfer level) or gate-level, in accordance with the present invention. In this flow diagram, RTL or Gate-Level HDL Code 801 goes through Compilation 803 to generate Sequential Circuit Model 804. Next, Compressors Synthesis 805 is performed according to Sequential Circuit Model 804 and Constraints 802 to generate Compressors RTL or Gate-Level HDL Code 806. The Compressors RTL or Gate-Level HDL Code 806 is generated as a combinational logic network comprising any combination of logic gates, such as AND gates, OR gates, NAND gates, NOR gates, XOR gates, XNOR gates, multiplexers, buffers, and inverters.

Having thus described presently preferred embodiments of the present invention, it can now be appreciated that the objectives of the invention have been fully achieved. And it will be understood by those skilled in the art that many changes in construction and circuitry, and widely differing embodiments and applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. A method for broadcasting compressed scan data patterns driven through N compressed scan inputs into decompressed scan data patterns stored in M scan chains, where N<M, using two or more decompressors separated by intermediate scan chains, in a scan-based integrated circuit, in a selected scan-test mode or selected self-test mode, the scan-based integrated circuit containing one or more scan chains, each scan chain comprising one or more scan cells coupled in series, the decompressors and intermediate scan chains embedded between the N compressed scan inputs and the M scan chains, with the N compressed scan inputs driving the first decompressor inputs, and the last decompressor outputs driving the M scan chains inputs; said method comprising:

(a) shifting-in said decompressed scan data patterns to all said scan cells in said scan-based integrated circuit by broadcasting said compressed scan data patterns driven through said N compressed scan inputs into said decompressed scan data patterns stored in said M scan chains using said two or more decompressors during a shift-in operation;

(b) capturing a scan data response to all said scan cells during a selected capture operation; and (c) shifting-out said scan data response for comparison or compaction during a shift-out operation.

2. The method of claim 1, wherein said shifting-in said decompressed scan data patterns to all said scan cells further comprises generating said compressed scan data patterns on an ATE (automatic test equipment) in said selected scan-test mode.

3. The method of claim 1, wherein said shifting-in said decompressed scan data patterns to all said scan cells further comprises automatically generating said compressed scan data patterns internally using a selected pattern generator in said selected self-test mode.

4. The method of claim 3, wherein said selected pattern generator is selectively a pseudorandom pattern generator (PRPG) or a random pattern generator (RPG).

5. The method of claim 1, wherein each said decompressor is a combinational logic network comprising one or more logic gates, including AND gates, OR gates, NAND gates, NOR gates, exclusive-OR (XOR) gates, exclusive-NOR (XNOR) gates, multiplexers (MUX gates), buffers, inverters, or any combination of the above.

6. The method of claim 1, wherein each said decompressor further accepts a set of control inputs to dynamically control each said decompressor, wherein said control inputs are selectively driven by primary inputs or generated internally.

7. The method of claim 1, wherein said shift-in operation and said shift-out operation occur concurrently.

8. An apparatus for broadcasting compressed scan data patterns driven through N compressed scan inputs into decompressed scan data patterns stored in M scan chains, where N<M, in a scan-based integrated circuit, in a selected scan-test mode or selected self-test mode, the scan-based integrated circuit containing one or more scan chains, each scan chain comprising one or more scan cells coupled in series; said apparatus comprising:
(a) two or more decompressors separated by intermediate scan chains, embedded between said N compressed scan inputs and said M scan chains, with said N compressed scan inputs driving the first decompressor inputs, and the last decompressor outputs driving said M scan chains inputs.

9. The apparatus of claim 8, wherein said compressed scan data patterns are generated on an ATE (automatic test equipment) in said selected scan-test mode.

10. The apparatus of claim 8, wherein said compressed scan data patterns are generated internally using a selected pattern generator in said selected self-test mode.

11. The apparatus of claim 10, wherein said selected pattern generator is selectively a pseudorandom pattern generator (PRPG) or a random pattern generator (RPG).

12. The apparatus of claim 8, wherein each said decompressor is a combinational logic network comprising one or more logic gates, including AND gates, OR gates, NAND gates, NOR gates, exclusive-OR (XOR) gates, exclusive-NOR (XNOR) gates, multiplexers (MUX gates), buffers, inverters, or any combination of the above.

13. The apparatus of claim 8, wherein each said decompressor further accepts a set of control inputs to dynamically control each said decompressor, wherein said control inputs are selectively driven by primary inputs or generated internally.

14. A method for synthesizing two or more decompressors separated by intermediate scan chains, embedded between N compressed scan inputs and M scan chains, with the N compressed scan inputs driving the first decompressor inputs, and the last decompressor outputs driving the M scan chains inputs in a scan-based integrated circuit, in a selected scan-test mode or selected self-test mode, the scan-based integrated circuit containing a plurality of scan chains, each scan chain comprising one or more scan cell coupled in series; said method comprising the computer-implemented steps of:
(a) compiling the RTL (register-transfer level) or gate-level HDL (hardware description language) code that represents said scan-based integrated circuit into a sequential circuit model;
(b) specifying a list of constraints on said two or more decompressors;
(c) synthesizing said two or more decompressors embedded between said N compressed scan chain inputs and said M scan chains in said scan-based integrated circuit; and
(d) generating the decompressors RTL or gate-level HDL code.

15. The method of claim 14, wherein each said decompressor is a combinational logic network comprising one or more logic gates, including AND gates, OR gates, NAND gates, NOR gates, exclusive-OR (XOR) gates, exclusive-NOR (XNOR) gates, multiplexers (MUX gates), buffers, inverters, or any combination of the above.

16. The method of claim 14, wherein each said decompressor further accepts a set of control inputs to dynamically control each said decompressor, wherein said control inputs are selectively driven by primary inputs or generated internally.

17. A method for compressing scan data responses stored in M scan chains into compressed scan data responses driven through N compressed scan outputs, where N<M, using two or more compressors separated by intermediate scan chains, in a scan-based integrated circuit, in a selected scan-test mode or selected self-test mode, the scan-based integrated circuit containing one or more scan chains, each scan chain comprising one or more scan cells coupled in series, the compressors and intermediate scan chains embedded between the M scan chains and the N compressed scan outputs, with the M scan chains outputs driving the first compressor inputs, and the last compressor outputs driving the N compressed scan outputs; said method comprising:
(a) shifting-in decompressed scan data patterns to all said scan cells in said scan-based integrated circuit during a shift-in operation;
(b) capturing said scan data responses to all said scan cells during a selected capture operation; and
(c) shifting-out said scan data responses for comparison or compaction, by compressing said scan data responses stored in said M scan chains into said compressed scan data responses driven through said N compressed scan outputs using said two or more compressors during a shift-out operation.

18. The method of claim 17, wherein said shifting-out said scan data responses further comprises comparing said compressed scan data responses on an ATE (automatic test equipment) in said selected scan-test mode.

19. The method of claim 17, wherein said shifting-out said scan data responses further comprises compacting said compressed scan data responses internally using a MISR (multiple-input signature register) in said selected self-test mode.

20. The method of claim 17, wherein each said compressor is a combinational logic network comprising one or more logic gates, including AND gates, OR gates, NAND gates, NOR gates, exclusive-OR (XOR) gates, exclusive-NOR (XNOR) gates, multiplexers (MUX gates), buffers, inverters, or any combination of the above.

21. The method of claim 17, wherein each said compressor further accepts a set of control inputs to dynamically control each said compressor, wherein said control inputs are selectively driven by primary inputs or generated internally.

22. The method of claim 17, wherein said shift-in operation and said shift-out operation occur concurrently.

23. An apparatus for compressing scan data responses stored in M scan chains into compressed scan data responses driven through N compressed scan outputs, where N<M, in a scan-based integrated circuit, in a selected scan-test mode or selected self-test mode, the scan-based integrated circuit containing one or more scan chains, each scan chain comprising one or more scan cells coupled in series; said apparatus comprising:
(a) two or more compressors separated by intermediate scan chains, embedded between said M scan chains and said N compressed scan outputs, with the M scan chains outputs driving the first compressor inputs, and the last compressor outputs driving the N compressed scan outputs.

24. The apparatus of claim 23, wherein said compressed scan data test responses are compared on an ATE (automatic test equipment) in said selected scan-test mode.

25. The apparatus of claim 23, wherein said compressed scan data test responses are compacted internally using a MISR (multiple-input signature register) in said selected self-test mode.

26. The apparatus of claim 23, wherein each said compressor is a combinational logic network comprising one or more logic gates, including AND gates, OR gates, NAND gates, NOR gates, exclusive-OR (XOR) gates, exclusive-NOR (XNOR) gates, multiplexers (MUX gates), buffers, inverters, or any combination of the above.

27. The apparatus of claim 23, wherein each said compressor further accepts a set of control inputs to dynamically control each said compressor, wherein said control inputs are selectively driven by primary inputs or generated internally.

28. A method for synthesizing two or more compressors separated by intermediate scan chains, embedded between M scan chains and N compressed scan outputs, with the M scan chains outputs driving the first compressor inputs, and the last compressor outputs driving the N compressed scan outputs in a scan-based integrated circuit, in a selected scan-test mode or selected self-test mode, the scan-based integrated circuit containing a plurality of scan chains, each scan chain comprising one or more scan cell coupled in series; said method comprising the computer-implemented steps of:
(a) compiling the RTL (register-transfer level) or gate-level HDL (hardware description language) code that represents said scan-based integrated circuit into a sequential circuit model;
(b) specifying a list of constraints on said two or more compressors;
(c) synthesizing said two or more compressors embedded between said M scan chains and said N compressed scan outputs in said scan-based integrated circuit; and
(d) generating the compressors RTL or gate-level HDL code.

29. The method of claim 28, wherein each said compressor is a combinational logic network comprising one or more logic gates, including AND gates, OR gates, NAND gates, NOR gates, exclusive-OR (XOR) gates, exclusive-NOR (XNOR) gates, multiplexers (MUX gates), buffers, inverters, or any combination of the above.

30. The method of claim 28, wherein each said compressor further accepts a set of control inputs to dynamically control each said compressor, wherein said control inputs are selectively driven by primary inputs or generated internally.

* * * * *